United States Patent [19]
Shoji

[11] Patent Number: 5,793,942
[45] Date of Patent: Aug. 11, 1998

[54] MEMORY CHIP ARCHITECTURE AND PACKAGING METHOD FOR INCREASED PRODUCTION YIELD

[75] Inventor: Masakazu Shoji, Warren, N.J.

[73] Assignee: Lucent Technologies Inc., Murray Hill, N.J.

[21] Appl. No.: 622,100

[22] Filed: Mar. 26, 1996

[51] Int. Cl.⁶ ............................................. G06F 11/00
[52] U.S. Cl. ....................................... 395/182.03
[58] Field of Search .................. 395/182.03, 183.06; 371/10.2, 22.5; 364/186; 365/200, 201, 230.01, 231, 244

[56] References Cited

U.S. PATENT DOCUMENTS

| | | | |
|---|---|---|---|
| 3,659,275 | 4/1972 | Marshall | 340/173 R |
| 3,753,235 | 8/1973 | Daughton et al. | 340/172.5 |
| 3,755,791 | 8/1973 | Arzubi | 340/173 R |
| 4,493,075 | 1/1985 | Anderson et al. | 371/10 |
| 4,720,817 | 1/1988 | Childers | 365/200 |
| 5,083,294 | 1/1992 | Okajima | 365/200 |
| 5,134,585 | 7/1992 | Murakami et al. | 365/200 |
| 5,199,033 | 3/1993 | McGeoch et al. | 371/10.1 |
| 5,237,531 | 8/1993 | Okano et al. | 365/189.01 |
| 5,278,793 | 1/1994 | Yeh | 365/200 |
| 5,303,192 | 4/1994 | Baba | 365/200 |
| 5,323,353 | 6/1994 | Griffus et al. | 365/226 |
| 5,381,371 | 1/1995 | Haraguchi | 365/200 |
| 5,537,665 | 7/1996 | Patel et al. | 395/182.03 |
| 5,644,541 | 7/1997 | Siu et al. | 365/200 |

*Primary Examiner*—Robert W. Beausoliel, Jr.
*Assistant Examiner*—Stephen C. Elmore

[57] ABSTRACT

A memory device and method of packaging to increase the production yield of large scale digital memory chips. The architecture provides the ability to house a plurality of partially defective memory chips into a single casing to provide the same memory as a non-defective chip, thus eliminating the need to discarding a chip having minor defects. The chips are divided into data blocks that can be individually tested and disabled so that only that defective block is discarded not the entire chip, thus increasing production yield.

25 Claims, 6 Drawing Sheets

REPRODUCED

REFERENCE → PASS
→ FAIL

REPRODUCED

↓ COMPRESSION

→ TEST 5,793,942

1

MEMORY CHIP ARCHITECTURE AND PACKAGING METHOD FOR INCREASED PRODUCTION YIELD

FIELD OF THE INVENTION

The present invention relates to digital memory chip production, and more particularly to a novel memory chip architecture that incorporates a quick testing method and an efficient packaging method to increase chip production yield and reduce the data storage cost of digital audio.

BACKGROUND OF THE INVENTION

Heretofore, large scale digital memories have been desirable storage devices for those interested in intensive data applications such as digital audio. One type of large scale digital memory device is a read-only memory (ROM). ROMs are devices composed of storage cells that, once programmed, store permanent information. That is, once a ROM is programmed with information, a processor can only access or read that information. The processor can not write information into the ROM or change the information stored in the ROM in any way.

ROM's have a ratio of storage capacity to chip size that is attractive for storing digital audio. Basically, a ROM is composed of a large set of storage cells packaged in a protective plastic housing. Metallic leads extending from the chip to pins located outside the housing provide a means for a processor to address the memory storage cells in specific locations of the ROM and to obtain the digital data permanently stored in that location.

One serious drawback to using ROM's for such audio storage, however, is the high costs associated with producing large-sized chips. The high cost is due to the large number of chips that are discarded during production for having defective storage cells. That is, in producing ROM's, the storage cells of each chip are systematically checked to determine whether the data stored in each location is the data expected therein. If a defect is found in any location of the ROM, the entire ROM chip is discarded. As one can imagine, such a strict testing procedure is time consuming, detrimental to achieving a high production yield and costly. As a result, present day ROM production is both costly and inefficient.

SUMMARY OF THE INVENTION

Accordingly, the present invention is directed to a method of increasing ROM chip production yield, and thus reducing the overall cost of ROM chip production. To attain this, the present invention provides an improved ROM chip architecture that enables the quick testing of ROM storage cells and the parallel packaging of a plurality of ROM chips in a single ROM device housing.

In general, the storage cells of each ROM chip are divided into a predetermined number of blocks or sub-blocks (i.e. N number of blocks) which are identical from chip to chip. The blocks or sub-blocks are connected to address and data lines so that each block of each chip can be individually tested for defective storage cells (i.e. through a built-in self-test (BIST) mechanism that utilizes cyclic redundancy counter (CRC) checking). In addition, each block has a disabling circuit through which access to the contents of the block can be permanently disabled (i.e. through a fuse that can be blown to disconnect the address lines to the chip). Moreover, each block is connected in parallel to its identical block in every other chip of the housing. That is, block X of chip 1 is connected with block X of chip 2.

2

The parallel architecture provides the ability to stack a plurality of chips, in parallel, in one housing. This eliminates the need to discard chips that are only partially defective (i.e. not every block of data in the chip is defective). As a result, if a block is found defective in a chip, that chip is not automatically discarded. Rather, the defective chip is placed in a housing with other chips so that the parallel connection thereof provides a single non-defective ROM. That is, the chip is packaged within the housing with other chips having defective data blocks such that the plurality of chips integrate to provide N non-defective blocks of storage space in one housing (wherein a perfect ROM chip has N blocks of storage space).

In one embodiment of the invention an 8 Mbyte ROM chip is divided into 4 blocks, each containing 2 Mbytes of data. The blocks are tested for defects through a testing means (i.e. a BIST). Due to the parallel architecture, the 4 blocks of storage cells can be parallel or sequentially tested, depending on the testing means used. Once a defective block A is identified, the address drive for that defective block is disabled through a built-in circuit breaker (i.e. a fuse) on the chip. This prevents any future data retrieval from block A of that ROM wafer. Since the remaining blocks are not defective they are still usable, and thus saved.

To replace defective or disabled block A and any other defective blocks found during the test so that the ROM device provides a full 8 Mbytes of storage space, a second chip (having the same four blocks of storage space) with a non-defective block A is placed in the ROM device housing. The addition of the second chip enables the single ROM device to provide four blocks of perfect memory, each having 2 MBytes of storage space. To avoid duplicate data retrieval, however, the remaining three blocks in the second chip are disabled through the built in circuit breakers, discussed above (since the first chip already provides these blocks).

This enables the present invention to provide the ability to utilize ROM chips that would be discarded under prior art ROM chip architecture, testing methods and packaging methods. For example, under the present invention, if a chip is found to be completely nondefective, only one chip is placed in the housing. And, if the chip has only limited defects, then two chips would be sufficient in the housing. Yet, if any number N of memory blocks are found defective, up to N chips can be placed in the chip housing. As a result, the present invention provides a more efficient use of chips that are only partially defective. Thus, the present invention overcomes, to a large extent, the limitations associated with the prior art.

These and other features of the invention are described in more complete detail in the following detailed description of the invention when taken with the drawings. The scope of the invention, however, is limited only by the claims appended hereto.

BRIEF DESCRIPTION OF THE FIGURES

For a better understanding of the present invention, reference may be had to the following description of exemplary embodiments thereof, considered in conjunction with the accompanying drawings, in which.

DETAILED DESCRIPTION OF THE INVENTION

Figure 1:
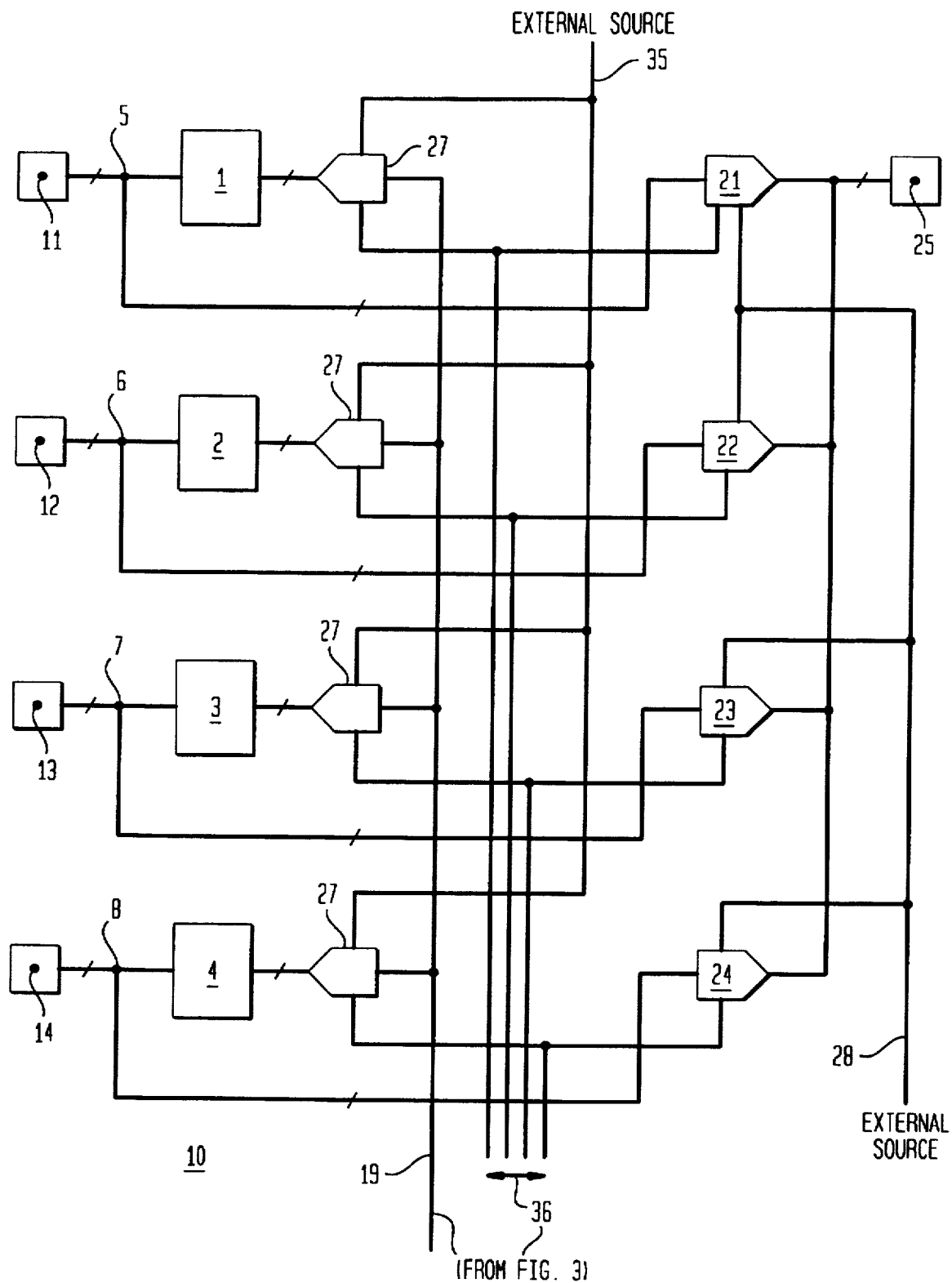
FIG. 1 shows a block diagram of one embodiment of the ROM chip architecture of the present invention.

Referring to FIG. 1, there is shown a block diagram of one embodiment of the architecture for the memory device of the present invention, hereinafter referred to as housing 10. Housing 10 contains at least one memory chip, wherein each memory chip is divided into four 2 MByte memory blocks, to provide 8 Mbytes of non-defective ROM.

As shown, each memory chip is divided into four memory blocks 1–4, each having 2 MBytes of memory. Output ports 5–8 of memory blocks 1–4 are electrically connected to test output ports 11–14, respectively, and to single output port 25 through transmission gates 21–24, respectively. Transmission gates 21–24 are controlled through output drive enable line 28 and block address drive enable lines 36.

Each memory block 1–4 is electrically connected to address lines or address bus 19 through an address drive logic circuit 27. Address drive logic 27 is controlled through global address drive enable 35 and block address drive enable 36. A more detailed view of address drive logic circuit 27 is shown in FIG. 2 and 3, and described in more detail below.

Figure 2:
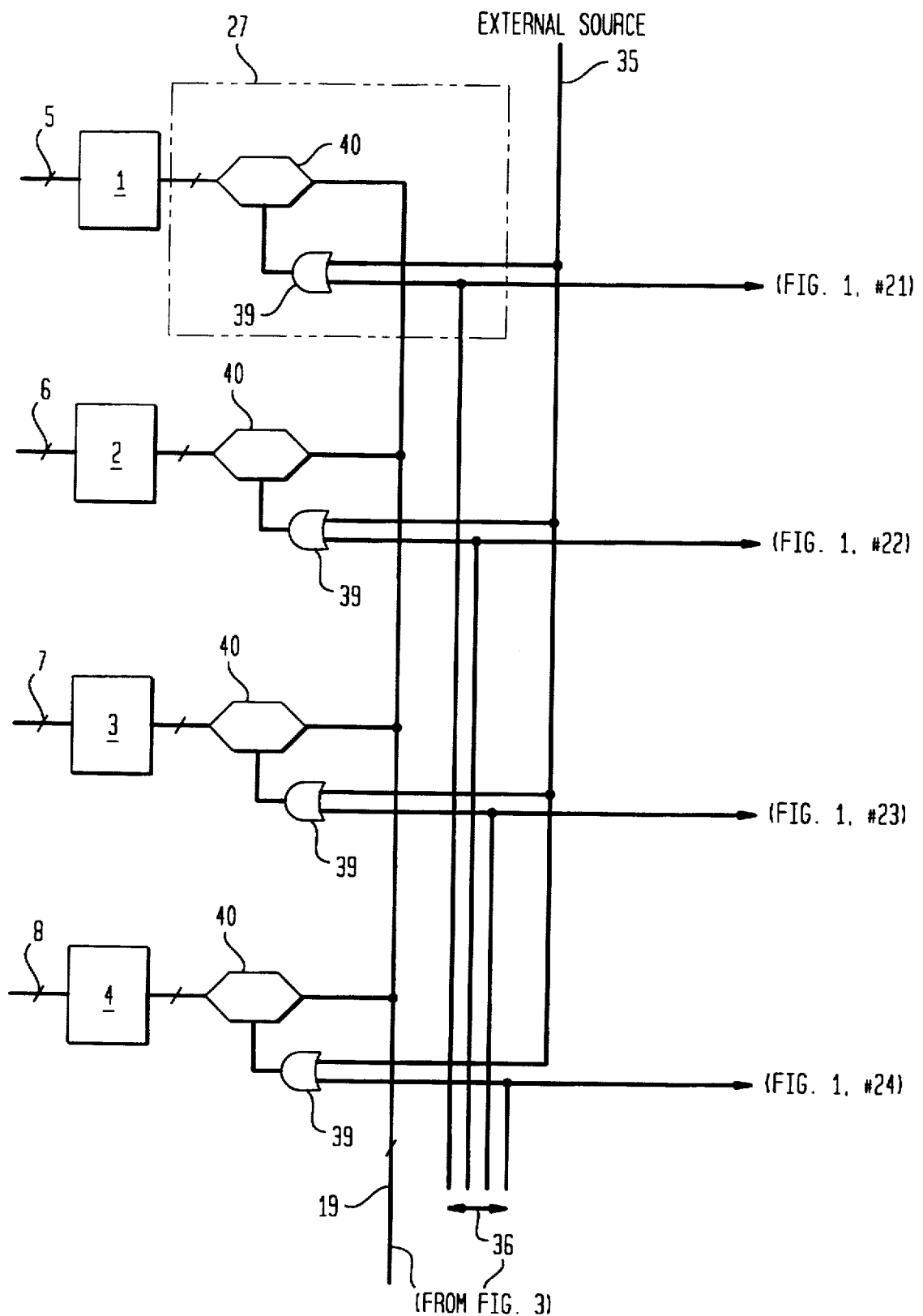
FIG. 2 shows a block diagram of the addressing circuitry for the BIST incorporated into the embodiment shown in FIG. 1.

Referring now to FIG. 2 there is shown address drive circuit 27 connected to memory blocks 1–4. As shown, block address drive enable lines 36 and global address lines 35 are electrically connected to logic gates 39 which are electrically connected to address drivers 40. Address drivers 40 are electrically connected to memory blocks 1–4.

Figure 3:
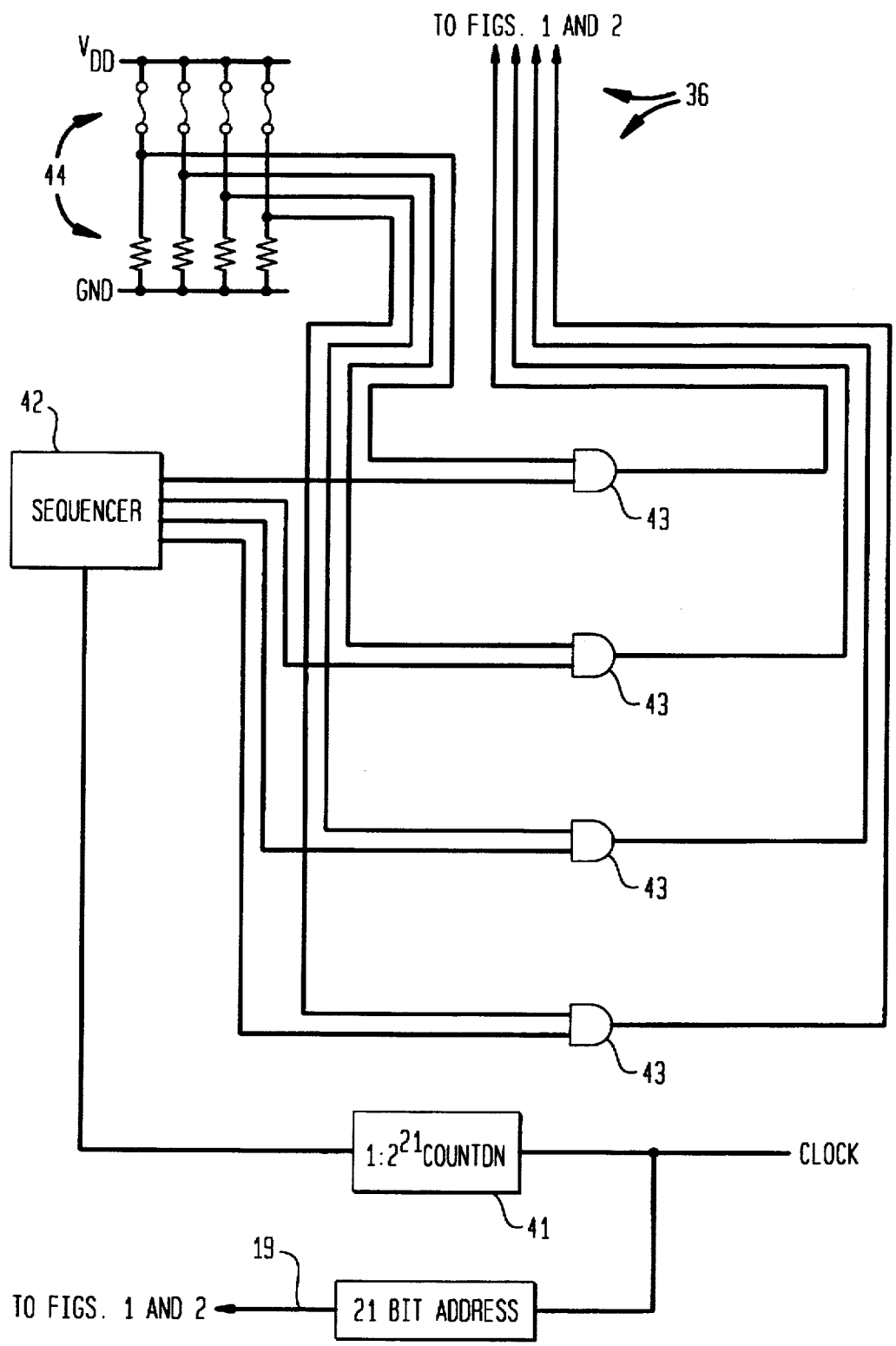
FIG. 3 shows a block diagram of the block disable circuitry of the embodiment shown in FIG. 1.

FIG. 3 shows the address generator circuitry that drives block address enable lines 36 and generates the desired memory address on address lines 19. As shown, a countdown circuit 41 is electrically connected to a sequencer 42 which drives gates 43. In addition, block disable fuse circuitry 44 is electrically connected to gates 43 which drive block enable address lines 36. A clock is electrically connected to both countdown circuit 41 and address bus 19.

In general, the storage cells of memory blocks 1–4, together with the address driver circuitry shown in FIGS. 2 and 3 and the output circuitry, enable the blocks of the entire chip to be tested in parallel or individually. In the embodiment described above, housing 10 can incorporate a BIST that utilizes cyclic redundancy counter (CRC) checking to determine if any of these blocks are defective. Irrespective of the testing method employed, however, if a defective block is found in a chip, the chip is not automatically discarded. Rather, additional chips are added to the housing such that the plurality of chips integrate to provide one whole ROM housing having four non-defective blocks of storage space, and thus one 8 Mbyte ROM.

More specifically, the chip architecture allows for the parallel packaging of more than one ROM chip in one ROM housing such that block A of each chip is connected in parallel to the address lines, data lines and control lines of the housing. Thus, eliminating the waste associated with discarding an entire chip when a defect is found in only one block of the ROM. A pictorial view of this parallel packaging of ROM chips is shown in FIGS. 4 and 5.

Figure 4:
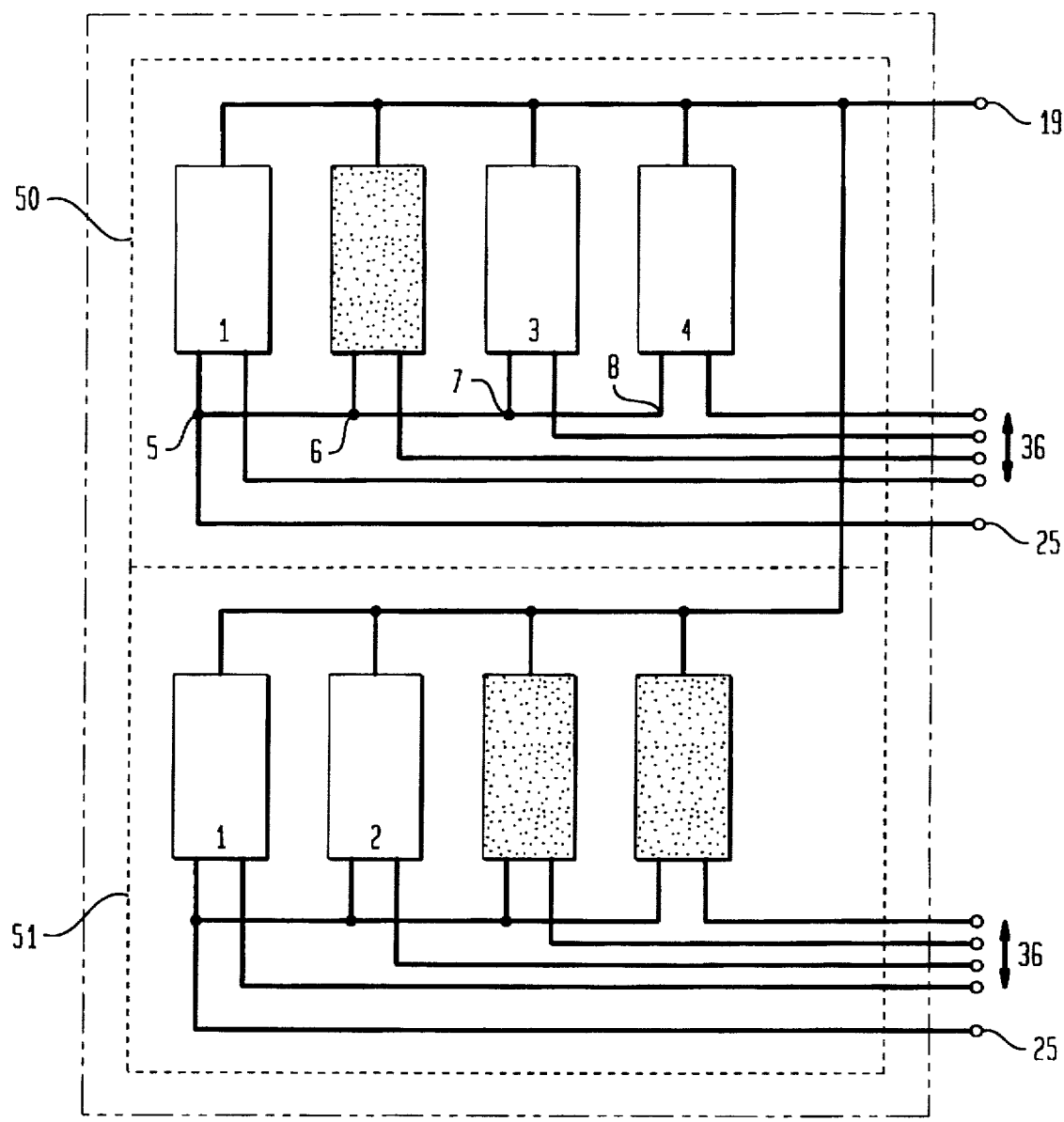
FIG. 4 shows the parallel connection of the data blocks of two chips in one housing of the present invention.
Figure 5:
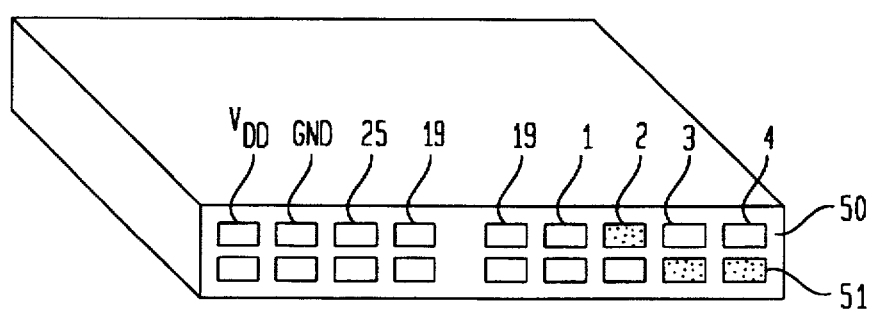
FIG. 5 shows a pictorial view of the housing and the parallel packaging of the two ROM wafers shown in FIG. 4.
Figure 6A:
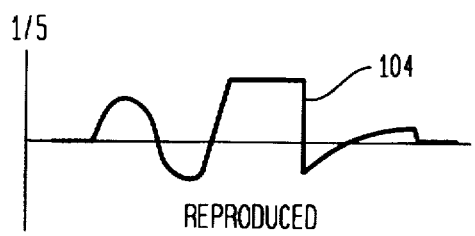
FIGS. 6(a), 6(b), 6(c) and 6(d) show a schematic of a time axis compression circuit for a real time audio test in accordance with the method of the present invention.
Figure 6B:
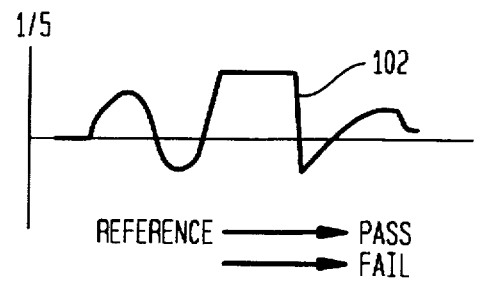
Figure 6C:
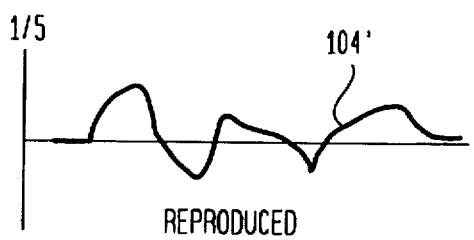
Figure 6D:
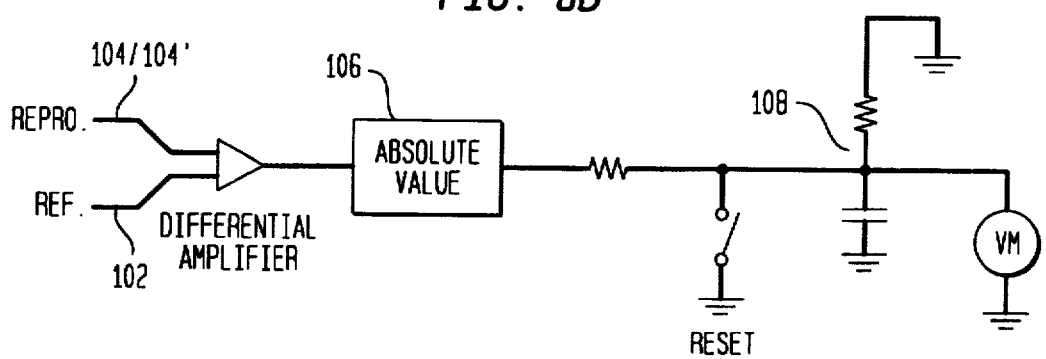

FIG. 4 shows a housing having two memory chips 50 and 51 connected so that their respective memory blocks 1–4 are connected in parallel to the address drive circuitry, the output port and the address enable lines described above. As shown block 2 of chip 50 and blocks 3 and 4 of chip 51 are defective. Note, however, that the two chips together provide four non-defective data blocks, and thus the full 8 MBytes of ROM desired. As a result, the testing mechanism is necessary to determine which blocks are defective and how many chips are needed to provide the full 8 MBytes of data.

One method of testing the memory includes a parallel test of the blocks of a chip simultaneously. Namely, the contents of specific locations in blocks 1–4 are addressed in parallel through address driver circuitry 27 and address lines 19. This enables the chip to be tested four times faster than with a sequential test.

After the parallel test, the faulty blocks are removed or disabled by blowing a predetermined fuse in fuse circuitry 44. By blowing the fuse, the corresponding block enable address line is pulled down, thus disabling that block on that chip. This prevents the faulty block from ever sending data to its respective output port, and thereby saving electrical power. Except for the minor circuits that are in standby, the two chips consume power close to that of a single chip.

To compensate for any disabled blocks, other chips having a good data block in that position of the memory are added to the housing. For example, if the first chip has one block, i.e. block 2, not working, then a second chip having a non-defective block 2 is added to the housing. Note, too, that all blocks, other than block 2 in the second chip are disabled through fuse circuitry 44 to insure that the housing does not provide two of the same blocks responding to one address. As a result, if a memory chip is completely non-defective, then only one chip needs to be placed in the housing. And, if there are a number of defective blocks, then additional chips can be added to the housing to compensate therefor. Moreover, since each chip can provide more than one non-defective block to the housing, defective chips can be matched to maximize production yield. For example, a first chip having defective blocks 1 and 2 can be matched with a second chip having non-defective blocks 1 and 2, but defective blocks 3 and 4.

Figure 7A:
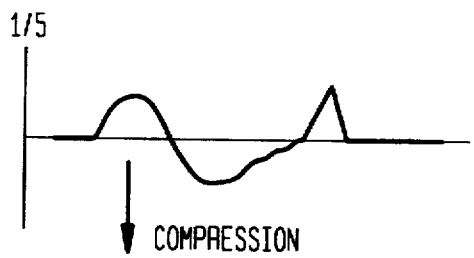
FIGS. 7(a) and 7(b) a graphical view of a time axis compression.
Figure 7B:
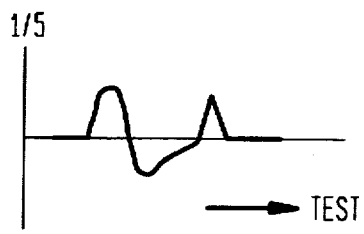
Figure 8:
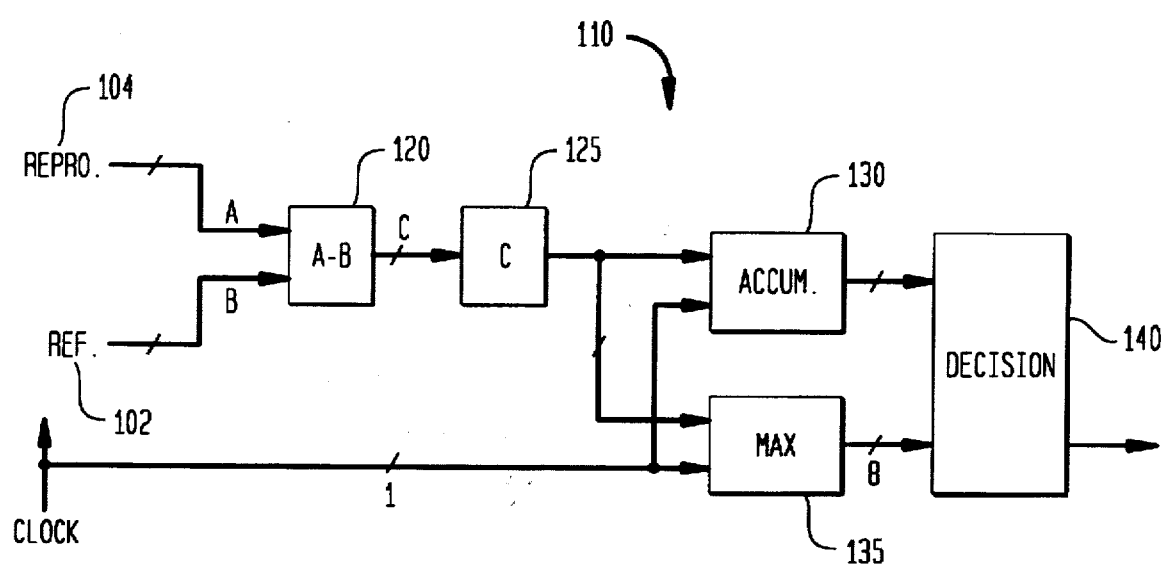
FIG. 8 shows a block diagram for a digital time axis compression scheme.

A testing method that can maximize the test time and the yield by passing a partially defective chip rather than a perfect chip is shown in FIGS. 6(a), 6(b), 6(c), 6(d), 7(a), 7(b) and 8. As shown in FIGS. 6(a), 6(b), 6(c), 6(d), 7(a), and 7(b), the expected data or standard sound 102 and the data retrieved from the chip during test (the reproduced sound) 104 or 104' are compared. As shown in FIGS. 7(a) and 7(b), the sound signal is stored in memory in a compressed format utilizing standard compression techniques. This compressed sound signal is then tested by the method of the present invention. Specifically, if a difference is found between the two, the absolute value 106 of that difference is taken. The absolute value signal is passed through a low pass filter 108 and a maximum is found. If the maximum exceeds a predetermined limit, its respective block is found defective, as indicated by the Pass path. Otherwise, the block is found to be tolerable as indicated by the Fail path. This increases the number of chips found non-defective, and thus increases the overall production yield. Moreover, as shown in FIG. 8, this same test scheme can be carried out digitally by means of a digital circuit 110. The digital time axis compression test scheme corresponds to the scheme illustrated in FIG. 6(d). Specifically, a reproduction signal 104 and a reference signal 102 are fed through a comparator 120 (corresponding to the differential amplifier), which produces, a difference signal C. An absolute value of difference signal C is determined by processor 125 (corresponding to absolute value 106). This value is then passed through accumulator 130 and compared against a max value by processor 135 and decision processor 140 (corresponding to low pass filter 108 and the voltage meter).

From the above, it should be understood that the embodiments described, in regard to the drawings, are merely exemplary and that a person skilled in the art may make variations and modifications to the shown embodiments without departing from the spirit and scope of the invention. All such variations and modifications are intended to be included within the scope of the invention as defined in the appended claims.

What is claimed is:

1. A read only memory device, comprising:
   at least two ROM chips, each of said at least two ROM chips having a predetermined number of data storage cells divided into a predetermined number of data blocks, said predetermined number of data blocks of each of said at least two ROM chips of the read only memory device, being located in identical locations within each respective ROM chip;
   an addressing circuit for retrieving data from said predetermined number of data storage cells in said predetermined number of data blocks;
   a housing for said at least two ROM chips, said housing facilitating parallel electrical connection of identically located data blocks of each of said at least two ROM chips to said addressing circuit; and
   a circuit for selectively disabling data retrieval from a predetermined data block of a predetermined ROM chip.

2. The read only memory of claim 1 wherein said addressing circuit sequentially addresses each of said predetermined number of data storage cells in each of said predetermined number of data blocks.

3. The read only memory of claim 1 wherein said addressing circuit is a parallel addresser for simultaneous retrieval of data from storage cells in separate data blocks.

4. The read only memory of claim 1 wherein said addressing circuit utilizes a 21 bit address bus.

5. The read only memory of claim 1 wherein said addressing circuit provides a means for testing said predetermined number of data storage cells of said at least two ROM chips.

6. The read only memory of claim 5 wherein said means for testing incorporates a built-in self test circuit that utilizes cyclic redundancy counter (CRC) checking.

7. The read only memory of claim 6 wherein said CRC checking is performed on each of said predetermined number of data blocks in each of said at least two ROM chips in a predetermined sequence.

8. The read only memory of claim 6 wherein said CRC checking is performed in parallel on said predetermined number of data blocks of a predetermined ROM chip.

9. The read only memory of claim 1 further comprising a built-in self test circuit to provide a quick testing means for said predetermined number of data blocks of each of said at least two ROM chips.

10. The read only memory of claim 9 wherein said built-in self test circuit has a bank of circuit breakers for selectively disabling access to some of said predetermined number of data blocks of each of said at least two ROM chips.

11. The read only memory of claim 9 wherein said quick testing means is a digital circuit.

12. The read only memory of claim 9 wherein said quick testing means is an analog circuit.

13. The read only memory of claim 1 wherein said circuit for selectively disabling a predetermined data block in a predetermined ROM chip utilizes a circuit breaker that disconnects said addressing circuit from said predetermined data block.

14. The read only memory of claim 1 wherein each of said at least two ROM chips is 64 Mbits.

15. The read only memory of claim 14 wherein said 64 Mbits is divided into four data blocks, each block containing 2 MBytes of data.

16. The read only memory chip of claim 14 wherein said 64 Mbits is divided into eight blocks of two million 4-bit nibbles.

17. The read only memory of claim 14 wherein said 64 Mbits is divided into sixteen data blocks, each block containing 4 Mbits of data.

18. The read only memory of claim 17 wherein said sixteen data blocks are further divided into a predetermined number of subblocks of data.

19. A large scale memory device, comprising:
   at least two ROM chips, each of said at least two ROM chips having a predetermined number of data storage cells, said predetermined number of data storage cells divided into a predetermined number of data blocks, each of said predetermined number of data blocks having an identical twin data block in each of said at least two ROM chips in the large scale memory device;
   an addressing circuit for retrieving data from said predetermined number of data storage cells in said predetermined number of data blocks;
   a built-in self test circuit for testing each of said predetermined number of data [block] blocks of each of said at least two ROM chips for defects;
   a multi-chip housing containing said at least two ROM chips, said multi-chip housing facilitating parallel electrical connection of said identical twin data block of each said at least two ROM chips to said addressing circuit and said built-in self test circuit; and
   a circuit for selectively disabling data retrieval from each of said predetermined number of data blocks of each of said at least two ROM chips.

20. A method of packaging ROM chips having a predetermined memory capacity, comprising the steps of:
   a. dividing each ROM chip into a predetermined number of data blocks so that said each of said predetermined number of data blocks of each said ROM chip are located in identical locations within each said ROM chip, each said predetermined number of data blocks of each said ROM chip having a separate output driver and a separate address driver;
   b. testing each said predetermined number of data blocks of each said ROM chip to determine if a defect exists therein;
   c. disabling each said separate address drivers of each defective data block found in step b to prevent any further access to data stored therein;
   d. placing a predetermined number of the ROM chips in a housing to provide the predetermined memory capacity, said housing facilitating parallel electrical connection of said predetermined number of the ROM chips to an addressing circuit; and e. disabling each of said predetermined number of data blocks of each said predetermined number of the ROM chips having a duplicate data block in another chip so that each of said predetermined number of data blocks defined in step a is addressed to only one of said predetermined number of the ROM chips in said housing.

21. The method of claim 20 wherein said testing step b is performed through a digital circuit.

22. The method of claim 20 wherein said testing step b is performed through an analog circuit.

23. The method of claim 20 wherein said placing of the ROM chips in said housing is selectively performed so that the packaging of the ROM chips minimizes the predetermined number of the ROM chips per said housing formed in step d.

24. A read only memory device, comprising:

a predetermined number of partially defective chips, each having a plurality of data blocks identically located, each of said plurality of data blocks having a predetermined number of storage cells;

each of said predetermined number of partially defective chips having at least one defective data block;

addressing means for retrieving data from each of said plurality of data blocks;

a housing for facilitating parallel electrical connection between said identically located plurality of data blocks to said addressing means to form a non-defective chip; and, disabling means for disabling said addressing means.

25. A ROM device, comprising:

at least two partially defective chips, each having a plurality of data blocks, each of said plurality of data blocks having a predetermined number of storage cells;

each of said at least two partially defective chips having at least one defective data block;

an addressing circuit electrically connected to said plurality of data blocks to provide a means for retrieving data from said predetermined number of storage cells;

a housing for facilitating parallel electrical connection between said identically located plurality of data blocks to said addressing circuit to form a non-defective chip; and, a disabling circuit electrically connected to said addressing circuit to provide a means for selectively disabling said addressing circuit.

* * * * *